(12) United States Patent
L'Heureux

(10) Patent No.: US 10,889,891 B2
(45) Date of Patent: Jan. 12, 2021

(54) APPARATUS FOR GASEOUS BYPRODUCT ABATEMENT AND FORELINE CLEANING

(71) Applicant: Applied Materials, Inc., Santa Clara, CA (US)

(72) Inventor: James L'Heureux, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/382,197

(22) Filed: Apr. 12, 2019

(65) Prior Publication Data

US 2019/0338419 A1 Nov. 7, 2019

Related U.S. Application Data

(60) Provisional application No. 62/667,187, filed on May 4, 2018.

(51) Int. Cl.
*B01D 53/68* (2006.01)
*C23C 16/44* (2006.01)
*H01L 21/67* (2006.01)

(52) U.S. Cl.
CPC .......... *C23C 16/4412* (2013.01); *B01D 53/68* (2013.01); *C23C 16/4405* (2013.01); *H01L 21/67017* (2013.01)

(58) Field of Classification Search
None
See application file for complete search history.

(56) References Cited

U.S. PATENT DOCUMENTS

| | | |
|---|---|---|
| 2005/0250347 A1 | 11/2005 | Bailey et al. |
| 2015/0252473 A1 | 9/2015 | Dickinson |
| 2015/0255256 A1* | 9/2015 | Cox .................. H01J 37/32669 156/345.29 |
| 2017/0133208 A1 | 5/2017 | Cox et al. |
| 2017/0173521 A1 | 6/2017 | Dickinson et al. |
| 2018/0073137 A1 | 3/2018 | Xavier et al. |
| 2018/0135171 A1* | 5/2018 | L'Heureux ............ C23C 16/455 |
| 2018/0337027 A1* | 11/2018 | L'Heureux ....... H01J 37/32862 |

* cited by examiner

*Primary Examiner* — Jelitza M Perez
(74) *Attorney, Agent, or Firm* — Patterson + Sheridan, LLP

(57) ABSTRACT

Embodiments disclosed herein include an abatement system and method for abating compounds produced in semiconductor processes. The abatement system includes a remote plasma source for generating an oxidizing plasma for treating exhaust gases from a deposition process performed in the processing chamber, the treatment assisting with the trapping particles in an exhaust cooling apparatus. The remote plasma source then generates a cleaning plasma for treating exhaust gases from a cleaning process performed in the processing chamber, the cleaning plasma reacting with the trapped particles in the exhaust cooling apparatus and cleaning the exhaust cooling apparatus.

15 Claims, 2 Drawing Sheets

APPARATUS FOR GASEOUS BYPRODUCT ABATEMENT AND FORELINE CLEANING

CROSS-REFERENCE TO RELATED APPLICATIONS

This application claims benefit of U.S. provisional patent application Ser. No. 62/667,187, filed May 4, 2018, which is hereby incorporated herein by reference.

BACKGROUND

Field

Embodiments of the present disclosure generally relate to semiconductor processing equipment. More particularly, embodiments of the present disclosure relate to an abatement system and a vacuum processing system for removing unwanted compounds produced during semiconductor processes.

Description of the Related Art

The process gases used by semiconductor processing facilities include many compounds, such as TEOS, $SiH_4$, which must be abated or treated before disposal, due to regulatory requirements and environmental and safety concerns. Conventional abatement technology can result in the formation of solid particles in the equipment downstream of the processing chamber, such as exhaust lines and pumps. If the solid particles formed in the equipment downstream of the processing chamber, such as exhaust lines and pumps, are not properly controlled, damage to the hardware in the pumping system can occur.

Accordingly, what is needed in the art is an improved abatement system for abating compounds produced in semiconductor processes.

SUMMARY

In one embodiment a reagent is injected into a plasma source to assist in the abatement of compounds. The plasma is used as an energy source to change the composition of the compounds coming from the chamber, the composition of the compounds is changed into different compounds that which better meet regulatory restrictions, improve safety and provide for improved exhaust pump and downstream abatement components lifetime and maintenance intervals.

In one embodiment an abatement system for a processing chamber is provided. The abatement system comprising an exhaust system including a vacuum pump coupled to the processing chamber, an exhaust cooling apparatus coupled to the exhaust system between the processing chamber and the vacuum pump, and a remote plasma source having an outlet for supplying a plasma to the exhaust system downstream of the processing chamber and before the exhaust cooling apparatus. The remote plasma source is connected to an oxygen gas source, a cleaning gas source and an inert gas source where the outlet of the remote plasma source is fluidly connected to enter an exhaust foreline at position that is adjacent to an entrance to the exhaust cooling apparatus' connection to the foreline.

In one embodiment a processing system is provided. The processing system comprising a processing chamber, an exhaust system including a vacuum pump coupled to the processing chamber, an exhaust cooling apparatus coupled to the exhaust system between the processing chamber and the vacuum pump, and a remote plasma source for supplying a plasma to the exhaust system downstream of the processing chamber and before the exhaust cooling apparatus. The remote plasma source is connected to an oxygen gas source, a cleaning gas source and an inert gas source, where the outlet of the remote plasma source is fluidly connected to enter an exhaust foreline at position that is adjacent to an entrance to the exhaust cooling apparatus' connection to the foreline.

In one embodiment a method for treating gases in an exhaust system of a processing chamber is provided. The method comprising treating exhaust gases from a deposition process performed in the processing chamber using an oxidizing plasma generated from a remote plasma source, trapping particles in an exhaust cooling apparatus, and treating exhaust gases from a cleaning process performed in the processing chamber using a cleaning plasma generated from a remote plasma source. The cleaning plasma reacting with the trapped particles in the exhaust cooling apparatus and cleaning the exhaust cooling apparatus.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
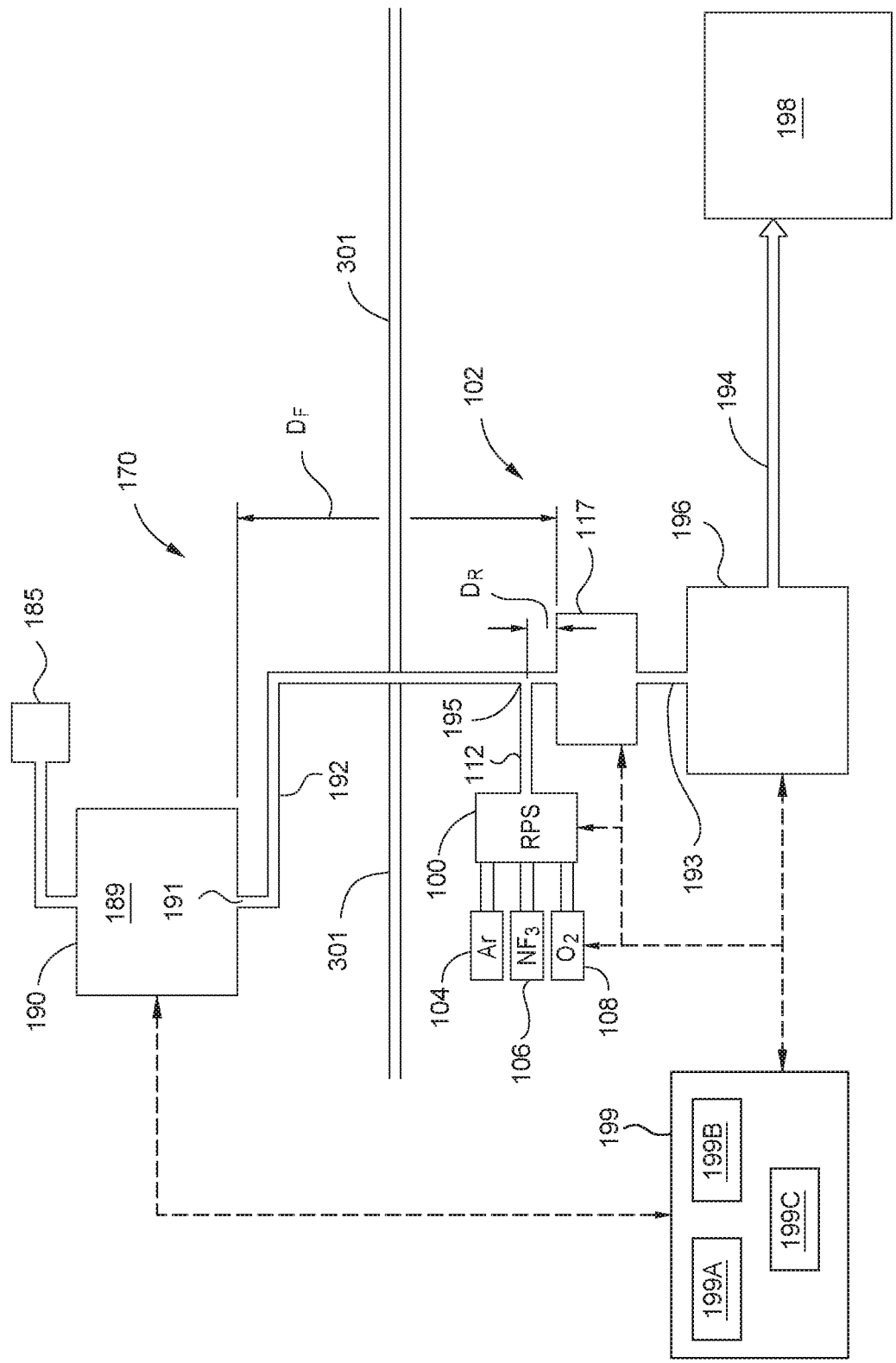
FIG. 1 is a schematic illustration of a processing chamber and abatement system including a remote plasma source and an exhaust cooling apparatus according to one embodiment described herein.

FIG. 1 is a schematic side view of a vacuum processing system 170 incorporating a remote plasma source 100 into abatement system 102. The vacuum processing system 170 includes at least a vacuum processing chamber 190 and the abatement system 102. The abatement system 102 includes at least the plasma source 100, the exhaust cooling apparatus 117 and a process vacuum pump 196. The vacuum processing chamber 190 is generally configured to perform at least one integrated circuit manufacturing process, such as a deposition process, an etch process, a plasma treatment process, a preclean process, an ion implant process, and/or other integrated circuit manufacturing process. In some embodiments, the vacuum processing chamber 190 is configured to process a substrate for device manufacturing, display or solar applications. The process performed in the vacuum processing chamber 190 may be plasma assisted, such as plasma assisted chemical vapor deposition chamber that is able to perform a plasma enhanced deposition process. For example, the process performed in the vacuum processing chamber 190 may be able to perform a plasma enhanced deposition process for depositing a silicon-based material using a silicon containing gas (e.g., silane, disilane) or a plasma etch process for removing a silicon-based material.

The vacuum processing chamber 190 has a chamber exhaust port 191 coupled to the exhaust cooling apparatus 117 of the abatement system 102 via an exhaust foreline 192. The exhaust cooling apparatus 117 is coupled to the vacuum processing chamber 190 in order to cool the exhaust exiting the plasma source 100 and to collect particles, such as silicon dioxide particles, formed in the exhaust foreline exiting from vacuum processing chamber 190. The exhaust cooling apparatus 117 is coupled to an exhaust conduit 193 and to process vacuum pump 196. The exhaust conduit 194 couples the vacuum pump 196 to burn/wet abatement subsystem 198. The process vacuum pump 196 is generally utilized to evacuate the vacuum processing chamber 190, while the burn/wet abatement subsystem 198 generally includes scrubbers or other exhaust cleaning apparatus for preparing the effluent of the vacuum processing chamber 190 to enter the atmosphere.

The exhaust cooling apparatus 117 is coupled between the vacuum processing chamber 190 and the process vacuum pump 196 for reducing the temperature of the exhaust in the exhaust foreline 192 and for collecting particles formed in the exhaust foreline 192. In one example, the exhaust cooling apparatus 117 is a part of the abatement system 102. The exhaust exiting the vacuum processing chamber 190 may deposit on cold surfaces (surfaces having a temperature substantially lower than the temperature of the exhaust) inside of the exhaust cooling apparatus 117. An example of the material that may be collected in the exhaust cooling apparatus is silicon dioxide.

In some embodiments, the vacuum processing chamber 190 includes a remote plasma source 185 for generating cleaning radicals, such as fluorine radicals, that are flowed into the processing region 189 of the vacuum processing chamber 190 to clean the vacuum processing chamber 190. Unreacted cleaning radicals may exit the vacuum processing chamber 190 and enter the exhaust foreline 192 and the exhaust cooling apparatus 117 removing materials previously deposited in exhaust foreline 192 and the exhaust cooling apparatus 117 during the integrated circuit manufacturing process. In some embodiments, the cleaning process performed within the vacuum processing chamber 190 is performed efficiently, which causes a minimum amount of unreacted cleaning radicals to exit the vacuum processing chamber 190 and enter the exhaust foreline 192. A cleaning process that efficiently cleans the vacuum processing chamber 190 will generally not provide enough cleaning radicals to effectively clean the exhaust cooling apparatus 117 during normal use.

Therefore, to assure that enough unreacted cleaning radicals reach and efficiently clean the exhaust cooling apparatus 117, the abatement system 102 includes the remote plasma source 100 that may be used to provide a cleaning plasma to clean the exhaust cooling apparatus 117. The remote plasma source 100 is utilized to perform an abatement process on gases and/or other materials exiting the vacuum processing chamber 190 so that such gases and/or other materials may be subsequently trapped or converted into a more environmentally and/or process equipment friendly composition. The remote plasma source maybe, for example, an inductively coupled plasma source, a capacitively coupled plasma source, a direct current plasma source, or a microwave plasma source. The remote plasma source 100 may be coupled to the abatement system 102, to ionize, cleaning, purge, carrier or other process gases, and to provide the ionized gases to the abatement system 102 and to generate cleaning radicals to clean the exhaust cooling apparatus 117. For example, a first gas supply source 104 may be couple to the remote plasma source 100 to provide an inert or non-reactive gas, such as argon (Ar) therethrough to the abatement system 102. A second gas supply source 106 may be couple to the remote plasma source 100 to provide a cleaning gas, such as $NF_3$, therethrough to the abatement system 102. Other contemplated cleaning gases include fluorocarbons and/or halogen containing gases, such as $NF_2H$, $CHF_3$, $CF_4$, $F_2$, HCl, $Cl_2$ and $SF_6$ and the like. Additionally, a third gas supply source 108 may be coupled to the remote plasma source 100 to provide a reactive agent, such as $O_2$, therethrough to the abatement system 102. The remote plasma source 100 may be coupled to the exhaust foreline 192 via a conduit 112, as shown in FIG. 1. The reactive gases facilitate the removal of accumulated deposits from the interior of the abatement system 102, thus reducing or eliminating the need for the disassembly of the abatement system 102 for cleaning. In one embodiment, cleaning radicals, such as an $NF_3$ plasma, generated in the plasma source 100, may flow into the exhaust foreline 192 and into exhaust cooling apparatus 117 to remove the solid byproduct materials or particles formed or collected in the exhaust cooling apparatus 117.

In one embodiment, an oxidizing reagent, such as an $O_2$ plasma, generated in the remote plasma source 100, may be delivered into the exhaust foreline 192 from the remote plasma source 100 to react with precursor product flowing from the vacuum processing chamber 190 to the process vacuum pump 196 during deposition processing. The oxidizing reagent reacts with the precursor byproducts from the deposition process and facilitates the conversion of precursor gas byproduct into solid byproducts or particles to enhance the amount of solid byproduct or particles trapped in the exhaust cooling apparatus 117. Increasing the amount of solid byproduct trapped in the exhaust cooling apparatus 117 reduces the amount of reactant byproduct gases that flow through the exhaust cooling apparatus 117 and into the process vacuum pump 196, exhaust conduit 194 and to burn/wet abatement subsystem 198, thereby increasing the life expectancy of the process vacuum pump 196 and burn/wet abatement subsystem 198, and also reducing the time between maintenance for the process vacuum pump 196 and burn/wet abatement subsystem 198 contributing to increased tool uptime.

The exhaust cooling apparatus 117 may be located a distance $D_F$, such as at least 10-40 feet or more, from the processing chamber 190 in a subfab location of the fabrication facility and may be separated by a facility wall or floor 301. An outlet of the remote plasma source 100 of the abatement system 102 may flow into the exhaust foreline 192 at a location 195 in the exhaust foreline that is substantially adjacent to an entrance of the exhaust cooling apparatus 117. In one example, the location 195 is positioned a distance $D_R$ before the exhaust foreline 192 enters the exhaust cooling apparatus 117, such as a distance of between 6 and 18 inches, or about 12 inches. It has been found the exhaust cooling apparatus 117 captures more solid byproduct material when an $O_2$ plasma, generated by the remote plasma source 100, is introduced into the exhaust foreline 192 at a distance $D_R$, between 6 and 18 inches, from the entrance to the exhaust cooling apparatus 117.

The exhaust conduit 194 allows gases to flow from the process vacuum pump 196 to the burn/wet abatement subsystem 198. The exhaust foreline 192, exhaust conduit 193, vacuum pump 196 and exhaust conduit 194, and associated hardware may be formed from one or more process-compatible materials, such as aluminum, anodized aluminum, nickel plated aluminum, stainless steel, and combinations and alloys thereof, for example. The exhaust cooling apparatus 117 may be formed of similar process-compatible materials, or made of materials conducive to condensation of the exhaust gases, for example. The burn/wet abatement subsystem 198 may be a burn/wet abatement subsystem, as is known in the semiconductor fabrication industry. For example, the abatement system 102 may be provided in a separate location from vacuum processing chamber 190 within the fabrication facility and separated from the vacuum processing chamber 190 by a wall or floor 301. The separation of the abatement system 102 from the vacuum processing chamber allows for maintenance of the abatement system in an environment that does not require as stringent clean room air purity class requirements.

The abatement system 102, including the remote plasma source 100, the first gas supply source 104, second gas supply source 106, third gas supply source 108 and the exhaust cooling apparatus 117 may be in communication with a controller 199. Controller 199 may also be in communication with vacuum processing chamber 190 and process vacuum pump 196.

The controller 199 may include a central processing unit (CPU) 199A, memory 199B, and support circuits (or I/O) 199C. The CPU may be one of any form of computer processors that are used in industrial settings for controlling various processes and hardware (e.g., motors, valves, power delivery components, and other related hardware) and monitor the processes (e.g., processing time and substrate position or location). The memory (not shown) is connected to the CPU, and may be one or more of a readily available memory, such as random access memory (RAM), read only memory (ROM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable by the abatement system 102. The program may be software readable by the controller and may include code to monitor and control, for example, the processing time and the abatement system process variables and processing actions.

In operation, controller 199 detects when deposition is occurring in the vacuum processing chamber 190 and causes an oxidizing reagent, generated in the remote plasma source 100 to be delivered to the exhaust foreline 192 to react with precursor product flowing from the vacuum processing chamber 190. The controller 199 also detects when the performance of the processing system is hindered by large amounts of particles accumulated in the exhaust cooling apparatus 117, and the controller 199 may cause the generation of a cleaning plasma using the remote plasma source 100, the cleaning plasma directed to the exhaust cooling apparatus to react with and remove the deposited particles in the exhaust cooling apparatus.

Figure 2:
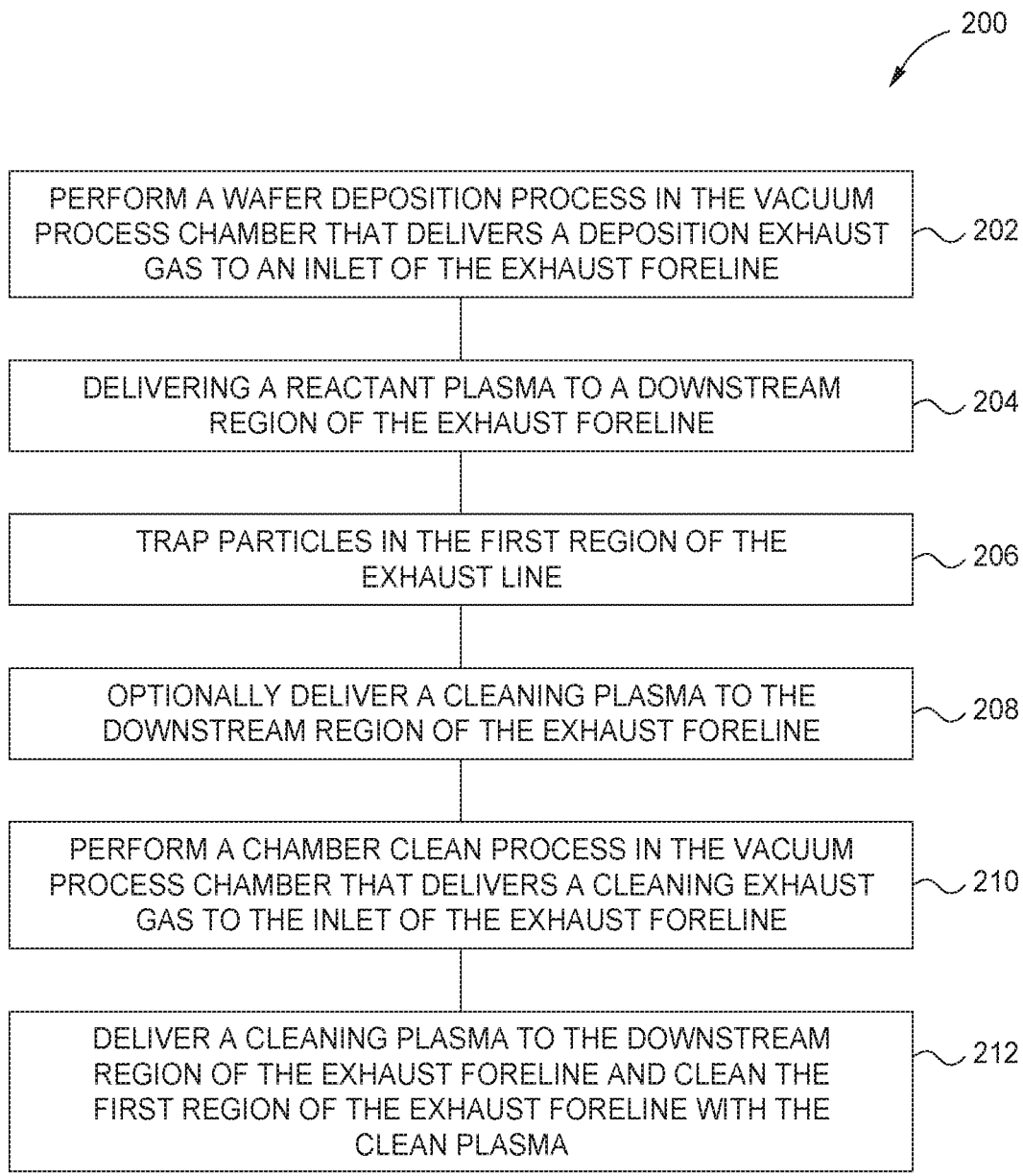
FIG. 2 depicts a flow chart of a method for treating an exhaust gas in according to one embodiment described herein.

FIG. 2 illustrates a method of using a reactive plasma enhanced gas to react with precursor byproducts flowing in the exhaust foreline, form solid byproducts and then trap the solid byproducts in the exhaust cooling apparatus. A subsequent plasma containing a cleaning gas reacts with the trapped solid byproducts to form a vaporizable material, in accordance with certain aspects of the present disclosure. As illustrated at operation block 202, a substrate deposition process is performed in the vacuum processing chamber forming exhaust gases. For example, with reference to FIG. 1, a plasma deposition process using precursor gases, such as TEOS or other silane based precursors, is performed in the processing region 189 of the vacuum processing chamber 190 to deposit a film on a substrate disposed therein. The process generates exhaust gases, including unprocessed precursor gases, which exit the chamber through chamber exhaust port 191 and into exhaust foreline 192 as an exhaust stream.

The operation continues at operation block 204 generating a reactive plasma in the abatement system using the remote plasma source 100 and mixing the plasma enhanced reactive gas with the exhaust stream delivered from the processing chamber 190. For example, with reference to FIG. 1, during the plasma deposition process, a reactive plasma using oxygen is generated in the remote plasma source 100 creating an oxidizing plasma. The oxidizing plasma enters exhaust foreline 192 via conduit 112 at location 195 in the foreline, a distance of between 6 and 18 inches from the exhaust cooling apparatus 117. The oxidizing plasma reacts with reactive, flammable and/or explosive gases found in the exhaust stream reducing the amount of flammable or explosive gases that enter the process vacuum pump 196 and further downstream that enter the burn/wet abatement subsystem 198 and other facility scrubber exhaust pumps. In one example, the reaction between the oxidizing plasma and the byproduct gases in the exhaust stream facilitates the conversion of the precursor byproduct gases into solid byproducts or particles, for example, silicon dioxide.

At operation block 206, the operation continues by trapping particles in a region of the exhaust line, for example exhaust cooling apparatus 117. As an example, (and referring to FIG. 1), the particles generated by the reaction between the precursor byproduct gases and the oxidizing plasma are trapped in the exhaust cooling apparatus 117 connected between vacuum processing chamber 190 and vacuum pump 196. The reactions that create the particles reduce the amounts of flammable or explosive gases in the exhaust stream. A decreased amount of flammable or explosive gases entering the pump 196 and burn/wet abatement subsystem 198 prolong the life of these components, decrease maintenance intervals and also increase tool uptime.

Operation block 208 is an optional cleaning operation to remove particles from the exhaust cooling apparatus prior to subsequent chamber clean operation block 210. In the event the performance of the processing system is hindered by large amounts of particles accumulated in the exhaust cooling apparatus, optional operation block 208 may be performed. At operation block 208, a cleaning plasma is generated in the abatement system 102 using the remote plasma source 100 and directing the cleaning plasma to the exhaust foreline 192 and into exhaust cooling apparatus 117. For example, after a determination is made that the amount of particles in the exhaust cooling apparatus is negatively affecting the performance of the vacuum processing system 170, a cleaning plasma, such as a fluorine plasma creating cleaning radicals, is generated in the remote plasma source 100 within abatement system 102. The cleaning plasma enters exhaust foreline 192 at location 195 via conduit 112 and enters exhaust cooling apparatus 117 and reacts with and removes the deposited particles. In one example, $NF_3$ is used as the cleaning gas to form the cleaning plasma. Other contemplated cleaning gases include fluorocarbons and halogen containing gases, such as $NF_2H$, $CHF_3$, $CF_4$, $F_2$, $HCl$, $Cl_2$ and $SF_6$ and the like.

The operation resumes at operation block 210 by performing a chamber clean process in the vacuum processing chamber 190. For example, (referring to FIG. 1) once the deposition process or series of deposition processes is complete, and between the processing of substrates, the remote plasma source 185, fluidly connected to the vacuum processing chamber, generates a cleaning plasma, such as a fluorine plasma creating cleaning radicals. The cleaning radicals flow into the processing region 189 of the vacuum processing chamber 190 to react with and remove deposited materials left on internal chamber walls and process chamber components from the deposition process. Suitable cleaning gases include fluorocarbons and halogen containing gases, such as $NF_3$, $NF_2H$, $CHF_3$, $CF_4$, $F_2$, $HCl$, $Cl_2$ and $SF_6$ and the like. The resulting cleaning process exhaust gases, including unreacted cleaning radicals, enter exhaust foreline 192 and abatement system 102.

At operation block 212, the operation continues by generating a cleaning plasma in the abatement system 102 using the remote plasma source 100 and mixing the cleaning plasma with the exhaust stream generated from the processing chamber cleaning process. For example, during the chamber clean process within the vacuum processing chamber 190, a cleaning plasma, such as a fluorine plasma creating cleaning radicals, is generated in the remote plasma source 100 within abatement system 102. The cleaning plasma enters exhaust foreline 192 at location 195 via conduit 112 and mixes with the exhaust gases in exhaust foreline 192. The cleaning plasma enters the exhaust cooling apparatus 117 and reacts with and removes the deposited particle materials left trapped in the exhaust cooling apparatus 117 during the deposition process. The deposited materials react with the cleaning plasma creating non-reactive gaseous byproducts that continue along exhaust conduit 193 and enter the process vacuum pump 196 and further downstream enter the burn/wet abatement subsystem 198 and other facility scrubber exhaust pumps. In one example, $NF_3$ is used as the cleaning gas to form the cleaning plasma. Suitable cleaning gases used to create the cleaning plasma include, but are not limited to, fluorocarbons and/or halogen containing gases, such as $NF_3$, $NF_2H$, $CHF_3$, $CF_4$, $F_2$, $HCl$, $Cl_2$ and $SF_6$ and the like. In one example, the $NF_3$ cleaning plasma reacts with the deposited particles, such as silicon dioxide, to form non-reactant gaseous $SiF_4$. The non-reactive $SiF_4$ flows through the process vacuum pump 196 and into the burn/wet abatement subsystem where the $SiF_4$ is again turned into particle material, such as silicon dioxide, where it can be easily removed from the burn/wet subsystem.

Thus an apparatus and method for treating flammable or explosive byproduct gases and preventing buildup of particles in vacuum forelines of deposition systems is provided. Exhaust gases from deposition processes may be treated with a reactive plasma to facilitate the treatment of reactant gases and facilitate the creation of byproduct particles that are trapped in an exhaust cooling apparatus. Exhaust gases from a subsequent processing chamber clean process are treated with a cleaning plasma using a cleaning gas such as $NF_3$ to react with the byproduct materials in the exhaust cooling apparatus to form non-reactive $SiF_4$ which flow out of the exhaust cooling apparatus and flow into the exhaust stream and towards the vacuum pump and other facilities abatement subsystems and exhaust scrubbers.

Benefits of aspects described herein include safer and faster cleaning of exhaust systems. Aspects described herein may reduce cleaning times of abatement components including the vacuum pump and burn/wet abatement unit. Additionally, the duration between timely and costly preventive maintenance may be extended improving tool uptime and decreasing maintenance costs.

While the foregoing is directed to aspects of the present disclosure, other and further aspects of the disclosure may be devised without departing from the basic scope thereof, and the scope thereof is determined by the claims that follow.

What is claimed is:

1. An abatement system for a processing chamber, comprising:
   an exhaust system comprising a vacuum pump coupled to the processing chamber;
   an exhaust cooling apparatus coupled to an exhaust foreline of the exhaust system between the processing chamber and the vacuum pump; and
   a remote plasma source positioned remote from the exhaust foreline and having a conduit that has an outlet for supplying a remote generated plasma directly to the exhaust foreline downstream of the processing chamber and before the exhaust cooling apparatus, and the remote plasma source connected to an oxygen gas source, a cleaning gas source and an inert gas source,
   wherein the outlet of the conduit of the remote plasma source is positioned to cause the remote generated plasma to enter the exhaust foreline at a position that is adjacent to an entrance to an exhaust cooling apparatus connection to the foreline.

2. The abatement system of claim 1, further comprising a controller, wherein the controller causes the remote plasma source to further supply a gas to the exhaust system.

3. The abatement system of claim 1, wherein the cleaning gas source supplies $NF_3$, $NF_2H$, $CHF_3$ or $CF_4$ to the remote plasma source.

4. The abatement system of claim 1, wherein the inert gas source supplies argon to the remote plasma source.

5. The abatement system of claim 1, wherein the outlet of the remote plasma source is fluidly connected to enter the exhaust foreline at a position within between 6 and 18 inches upstream from the entrance to the exhaust cooling apparatus.

6. The abatement system of claim 1, wherein the remote plasma source is one of an inductively coupled plasma source, a capacitively coupled plasma source, a direct current plasma source or a microwave plasma source.

7. The abatement system of claim 1, wherein the outlet of the remote plasma source is positioned in the exhaust foreline and at least 10 feet from a location where the exhaust foreline couples to a chamber exhaust port.

8. A processing system, comprising:
   a processing chamber;
   an exhaust system comprising a vacuum pump coupled to the processing chamber;
   an exhaust cooling apparatus coupled to an exhaust foreline of the exhaust system between the processing chamber and the vacuum pump; and
   a remote plasma source positioned remote from the exhaust foreline and having a conduit that connects the remote plasma source to the exhaust foreline for supplying a remote generated plasma directly to the exhaust foreline downstream of the processing chamber and before the exhaust cooling apparatus, the remote plasma source connected to an oxygen gas source, a cleaning gas source and an inert gas source,
   wherein an outlet of the conduit of the remote plasma source is positioned to cause the remote generated plasma to enter the exhaust foreline at a position that is adjacent to an entrance to an exhaust cooling apparatus connection to the foreline.

9. The processing system of claim 8, further comprising a controller, wherein the controller causes the remote plasma source to further supply a gas to the exhaust system.

10. The processing system of claim 8, wherein the cleaning gas source supplies $NF_3$, $NF_2H$, $CHF_3$ or $CF_4$ to the remote plasma source.

11. The processing system of claim 8, wherein the inert gas source supplies argon to the remote plasma source.

12. The processing system of claim 8, wherein the outlet of the remote plasma source is fluidly connected to enter the exhaust foreline at a position within between 6 and 18 inches upstream from the entrance to the exhaust cooling apparatus.

13. The processing system of claim 8, wherein the remote plasma source is one of an inductively coupled plasma source, a capacitively coupled plasma source, a direct current plasma source or a microwave plasma source.

14. The processing system of claim 8, wherein the outlet of the remote plasma source is positioned in the exhaust foreline and at least 10 feet from where the exhaust foreline couples to a chamber exhaust port.

15. A system comprising a controller, wherein the controller comprises a central processing unit and a memory, and the memory further includes software that when executed by the central processing unit causes the following operations to be performed:
    treating of exhaust gases from a deposition process performed in a processing chamber of the system using an oxidizing plasma generated from a remote plasma source that has an outlet that is coupled to an exhaust foreline that fluidly connects the processing chamber and an exhaust cooling apparatus, which is fluidly connected to a vacuum pump, wherein the oxidizing plasma comprises an oxidizing gas; and
    treating of exhaust gases from a cleaning process performed in the processing chamber of the processing system using a cleaning plasma generated from the remote plasma source, wherein
        the cleaning plasma comprises a cleaning gas provided from a cleaning gas source, and
        the outlet of the remote plasma source is positioned to cause the generated oxidizing plasma and the generated cleaning plasma to enter the exhaust foreline at a position that is adjacent to an entrance of the exhaust cooling apparatus.

\* \* \* \* \*